United States Patent
Bauer

(10) Patent No.: US 11,537,151 B2
(45) Date of Patent: Dec. 27, 2022

(54) MULTI-CHANNEL FLOW RATIO CONTROLLER AND PROCESSING CHAMBER

(71) Applicant: Applied Materials, Inc., Santa Clara, CA (US)

(72) Inventor: Matthias Bauer, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/848,594

(22) Filed: Apr. 14, 2020

(65) Prior Publication Data

US 2020/0241580 A1 Jul. 30, 2020

Related U.S. Application Data

(63) Continuation of application No. 15/418,489, filed on Jan. 27, 2017, now Pat. No. 10,691,145.
(Continued)

(51) Int. Cl.
*H01L 21/02* (2006.01)
*G05D 11/13* (2006.01)
(Continued)

(52) U.S. Cl.
CPC .......... *G05D 11/13* (2013.01); *C23C 16/4408* (2013.01); *C23C 16/45574* (2013.01);
(Continued)

(58) Field of Classification Search
CPC ................ C23C 16/4408; C23C 16/52; C23C 16/45574
See application file for complete search history.

(56) References Cited

U.S. PATENT DOCUMENTS 6,821,825 B2 11/2004 Todd et al.
6,958,253 B2 10/2005 Todd
(Continued)

FOREIGN PATENT DOCUMENTS

| JP | 2007324286 A | 12/2007 |
|---|---|---|
| KR | 10-2013-0014345 A | 2/2013 |
| KR | 10-2014-0145565 A | 12/2014 |

OTHER PUBLICATIONS

PCT Notification of Transmittal of the International Search Report and the Written Opinion of the International Searching Authority for International Application No. PCT/US2017/015475; dated Jun. 30, 2017; 11 total pages.
(Continued)

*Primary Examiner* — Joseph A Miller, Jr.
(74) *Attorney, Agent, or Firm* — Patterson + Sheridan, LLP

(57) ABSTRACT

Implementations of the present disclosure generally relate to one or more flow ratio controllers and one or more gas injection inserts in the semiconductor processing chamber. In one implementation, an apparatus includes a first flow ratio controller including a first plurality of flow controllers, a second flow ratio controller including a second plurality of flow controllers, and a gas injection insert including a first portion and a second portion. The first portion includes a first plurality of channels and the second portion includes a second plurality of channels. The apparatus further includes a plurality of gas lines connecting the first and second pluralities of flow controllers to the first and second pluralities of channels. One or more gas lines of the plurality of gas lines are each connected to a channel of the first plurality of channels and a channel of the second plurality of channels.

20 Claims, 4 Drawing Sheets

Related U.S. Application Data

(60) Provisional application No. 62/403,583, filed on Oct. 3, 2016.

(51) Int. Cl.
| | | |
|---|---|---|
| *H01L 21/67* | (2006.01) | |
| *C23C 16/44* | (2006.01) | |
| *C23C 16/455* | (2006.01) | |
| *C23C 16/52* | (2006.01) | |
| *G05D 7/06* | (2006.01) | |

(52) U.S. Cl.
CPC ........... *C23C 16/52* (2013.01); *G05D 7/0635* (2013.01); *G05D 7/0652* (2013.01); *H01L 21/0254* (2013.01); *H01L 21/02532* (2013.01); *H01L 21/02546* (2013.01); *H01L 21/6719* (2013.01); *H01L 21/67115* (2013.01)

(56) References Cited

U.S. PATENT DOCUMENTS

| | | |
|---|---|---|
| 7,289,865 B2 | 10/2007 | Bauer |
| 7,939,447 B2 | 5/2011 | Bauer et al. |
| 8,067,061 B2 | 11/2011 | Aggarwal et al. |
| 8,088,223 B2 | 1/2012 | Todd et al. |
| 8,486,191 B2 | 7/2013 | Aggarwal et al. |
| 9,117,670 B2 | 8/2015 | Abedijaber et al. |
| 9,322,097 B2 | 4/2016 | Aboagye et al. |
| 2003/0000924 A1 | 1/2003 | Strang |
| 2007/0281084 A1 | 12/2007 | Hirosawa et al. |
| 2013/0019803 A1 | 1/2013 | Samir et al. |
| 2013/0143415 A1 | 6/2013 | Yudovsky et al. |
| 2013/0255784 A1 | 10/2013 | Ye et al. |
| 2015/0267299 A1 | 9/2015 | Hawkins et al. |
| 2018/0095480 A1 | 4/2018 | Bauer |

OTHER PUBLICATIONS

Taiwanese Office Action (with attached English translation of the Search Report) for Application No. 106130085; dated Apr. 2, 2019; 10 total pages.

Korean Office Action dated Aug. 20, 2020 for Application No. 10-2019-7012921.

Korean Office Action dated Jun. 17, 2021 for Application No. 10-2021-7011058.

MULTI-CHANNEL FLOW RATIO CONTROLLER AND PROCESSING CHAMBER

CROSS-REFERENCE TO RELATED APPLICATIONS

This application is a continuation of U.S. patent application Ser. No. 15/418,489, filed Jan. 27, 2017, which claims priority to U.S. Provisional Patent Application No. 62/403,583, filed on Oct. 3, 2016, which herein is incorporated by reference.

BACKGROUND

Field

Implementations of the present disclosure generally relate to a semiconductor processing chamber, and more particularly, to one or more flow ratio controllers and one or more gas injection inserts in the semiconductor processing chamber.

Description of the Related Art

Semiconductor substrates are processed for a wide variety of applications, including the fabrication of integrated devices and micro-devices. One method of processing substrates includes depositing a material, such as a dielectric material or a semiconductive material, on an upper surface of the substrate. The material may be deposited in a lateral flow chamber by flowing a process gas parallel to the surface of a substrate positioned on a support, and thermally decomposing the process gas to deposit a material from the gas onto the substrate surface. However, the material deposited on the surface of the substrate is often non-uniform in thickness and non-uniform in alloy or dopant compositions, and therefore, negatively affects the performance of the final manufactured device.

Therefore, there is a need for an improved chamber to deposit a material that is uniform in thickness and in alloy or dopant compositions.

SUMMARY

Implementations of the present disclosure generally relate to a semiconductor processing chamber, and more particularly, to one or more flow ratio controllers and one or more gas injection inserts in the semiconductor processing chamber. In one implementation, an apparatus includes a first flow ratio controller including a first plurality of flow controllers, a second flow ratio controller including a second plurality of flow controllers, and a gas injection insert including a first portion and a second portion. The first portion includes a first plurality of channels and the second portion includes a second plurality of channels. The apparatus further includes a plurality of gas lines connecting the first and second pluralities of flow controllers to the first and second pluralities of channels, wherein one or more gas lines of the plurality of gas lines are each connected to a channel of the first plurality of channels and a channel of the second plurality of channels.

In another implementation, an apparatus includes a first flow ratio controller including a first plurality of flow controllers and a first flow controller, a second flow ratio controller including a second plurality of flow controllers and a second flow controller, and a gas injection insert including a first portion and a second portion. The first portion includes a first plurality of channels and a first inner channel and the second portion includes a second plurality of channels and a second inner channel. The apparatus further includes a plurality of gas lines connecting the first and second pluralities of flow controllers to the first and second pluralities of channels, a first gas line connecting the first flow controller to the first inner channel, and a second gas line connecting the second flow controller to the second inner channel.

In another implementation, an apparatus includes a chamber including an upper dome, a lower dome, a base ring disposed between the upper dome and the lower dome, and a gas injection insert located within the base ring. The gas injection insert includes a first portion and a second portion. The first portion includes a first plurality of channels and the second portion includes a second plurality of channels. The apparatus further includes a first flow ratio controller including a first plurality of flow controllers, a second flow ratio controller including a second plurality of flow controllers, and a plurality of gas lines connecting the first and second pluralities of flow controllers to the first and second pluralities of channels. One or more gas lines of the plurality of gas lines are each connected to a channel of the first plurality of channels and a channel of the second plurality of channels.

Figure 1:
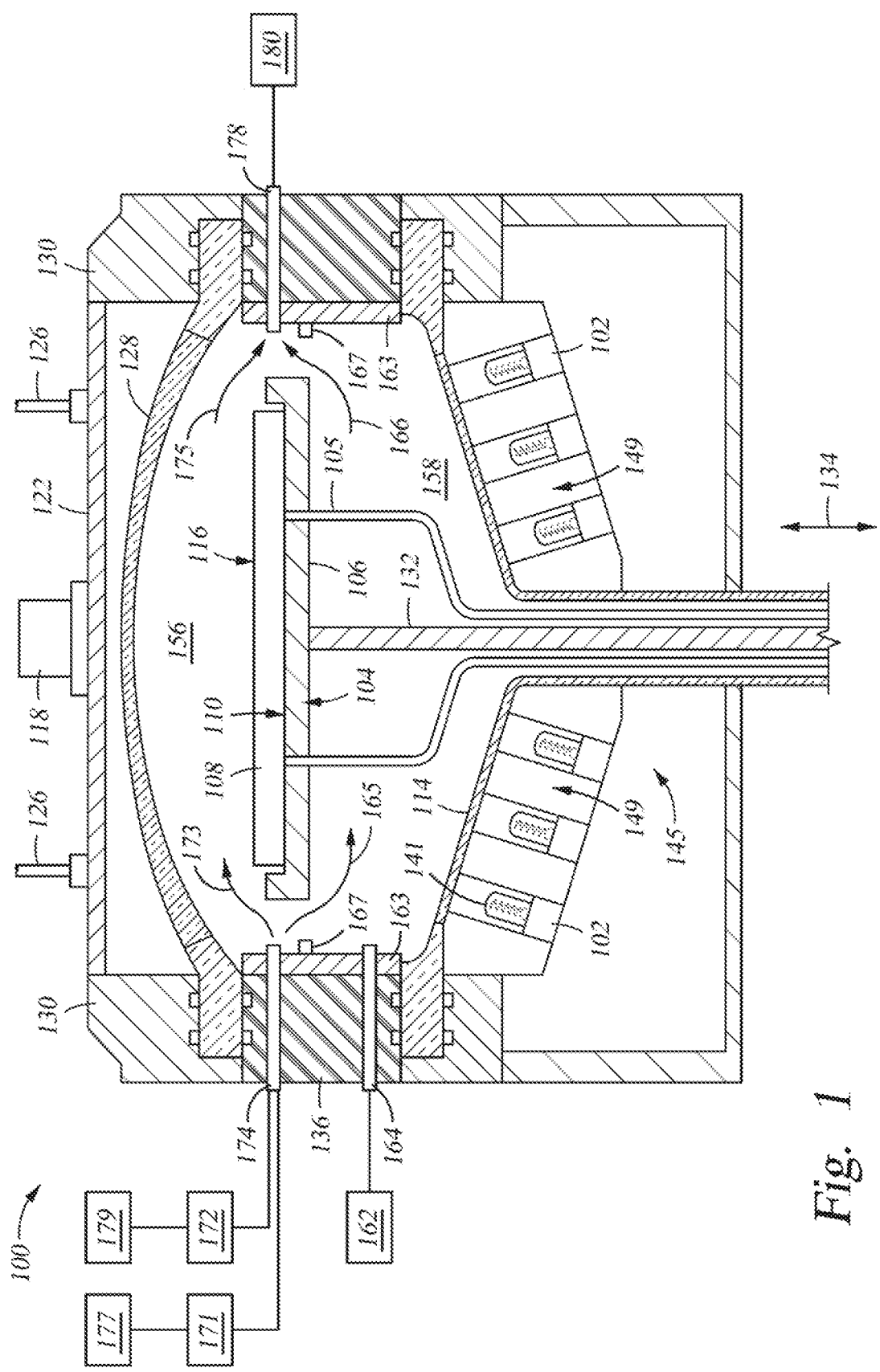
FIG. 1 is a schematic side cross-sectional view of a chamber according to implementations described herein.

To facilitate understanding, identical reference numerals have been used, wherever possible, to designate identical elements that are common to the figures. It is also contemplated that elements disclosed in one implementation may be beneficially utilized on other implementations without specific recitation.

DETAILED DESCRIPTION

Implementations of the present disclosure generally relate to using one or more flow ratio controllers and one or more gas injection inserts with a semiconductor processing chamber. In one implementation, an apparatus includes a first flow ratio controller including a first plurality of flow controllers, a second flow ratio controller including a second plurality of flow controllers, and a gas injection insert including a first portion and a second portion. The first portion of the gas injection insert includes a first plurality of channels and the second portion of the gas injection insert includes a second plurality of channels. The apparatus further includes a plurality of gas lines connecting the first and second pluralities of flow controllers to the first and second pluralities of channels. One or more gas lines of the plurality of gas lines are each connected to a channel of the first plurality of channels and a channel of the second plurality of channels.

FIG. 1 illustrates a schematic side cross-sectional view of a chamber 100 according to implementations described herein. The chamber 100 may be used to process one or more substrates, including the deposition of a material on an upper surface of a substrate 108. The chamber 100 may include an array of radiant heating lamps 102 for heating, among other components, a back side 104 of a substrate support 106 disposed within the chamber 100. In some implementations, the array of radiant heating lamps 102 may be disposed over an upper dome 128. The substrate support 106 may be a disk-like substrate support 106 as shown, or may be a ring-like substrate support with no central opening, which supports the substrate from the edge of the substrate to facilitate exposure of the substrate to the thermal radiation of the lamps 102. In some implementations, the substrate support 106 may include multiple arms for supporting the substrate 108.

The substrate support 106 is located within the chamber 100 between the upper dome 128 and a lower dome 114. The upper dome 128, the lower dome 114 and a base ring 136 that is disposed between the upper dome 128 and lower dome 114 generally define an internal region of the process chamber 100. The substrate 108 can be brought into the chamber 100 and positioned onto the substrate support 106 through a loading port (not shown).

The substrate support 106 is shown in an elevated processing position, but may be vertically traversed by an actuator (not shown) to a loading position below the processing position to allow lift pins 105 to contact the lower dome 114 to raise the substrate 108 from the substrate support 106. A robot (not shown) may then enter the chamber 100 to engage and remove the substrate 108 therefrom through the loading port.

The substrate support 106, while located in the processing position, divides the internal volume of the chamber 100 into a process gas region 156 above the substrate support 106, and a purge gas region 158 below the substrate support 106. The substrate support 106 may be rotated during processing by a central shaft 132 to minimize the effect of thermal and process gas flow spatial anomalies within the chamber 100 and thus facilitate uniform processing of the substrate 108. The substrate support 106 is supported by the central shaft 132, which moves the substrate 108 in an up and down direction 134 during loading and unloading, and in some instances, processing of the substrate 108. The substrate support 106 may be formed from silicon carbide or graphite coated with silicon carbide to absorb radiant energy from the lamps 102 and conduct the radiant energy to the substrate 108.

The central window portion of the upper dome 128 and the bottom of the lower dome 114 are formed from an optically transparent material such as quartz. One or more lamps, such as an array of lamps 102, can be disposed adjacent to and beneath the lower dome 114 in a specified manner around the central shaft 132 to independently control the temperature at various regions of the substrate 108 as the process gas passes over, thereby facilitating the deposition of a material onto the upper surface of the substrate 108. While not discussed here in detail, the deposited material may include silicon, silicon germanium, gallium arsenide, gallium nitride, or aluminum gallium nitride.

The lamps 102 may include bulbs 141 to heat the substrate 108 to a temperature within a range of about 200 degrees Celsius to about 1600 degrees Celsius. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 cools the lower dome 114 due in part to the close proximity of the lamphead 145 to the lower dome 114. The lamphead 145 may also cool the lamp walls and walls of the reflectors (not shown) around the lamps 102.

An annular shield 167 may be optionally disposed around the substrate support 106 and surrounded by a liner assembly 163. The annular shield 167 prevents or minimizes leakage of heat/light noise from the lamps 102 to the device side 116 of the substrate 108 while providing a pre-heat zone for the process gases. The annular shield 167 may be made from CVD SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the processing volume (i.e., the process gas region 156 and purge gas region 158) from metallic walls of the process chamber 100. The metallic walls may react with precursors and cause contamination in the processing volume. While the liner assembly 163 is shown as a single body, the liner assembly 163 may include one or more liners with different configurations.

As a result of backside heating of the substrate 108 from the substrate support 106, the use of an optical pyrometer 118 for temperature measurements/control on the substrate support can be performed. This temperature measurement by the optical pyrometer 118 may also be done on substrate device side 116 having an unknown emissivity since heating the substrate front side 110 in this manner is emissivity independent. As a result, the optical pyrometer 118 can only sense radiation from the hot substrate 108 that conducts from the substrate support 106, with minimal background radiation from the lamps 102 directly reaching the optical pyrometer 118.

A reflector 122 may be optionally placed outside the upper dome 128 to reflect infrared light that is radiating off the substrate 108 back onto the substrate 108. The reflector 122 may be secured to the upper dome 128 using a clamp ring 130. The reflector 122 can be made of a metal such as aluminum or stainless steel. The efficiency of the reflection can be improved by coating a reflector area with a highly reflective coating such as with gold. The reflector 122 can have one or more channels 126 connected to a cooling source (not shown). Each channel 126 connects to a passage (not shown) formed on a side of the reflector 122. The passage is configured to carry a flow of a fluid such as water and may run horizontally along the side of the reflector 122 in any pattern covering a portion or entire surface of the reflector 122 for cooling the reflector 122.

Process gases supplied from process gas supply sources 177, 179 are introduced into the process gas region 156 through a gas injection insert 174 located in the sidewall of the base ring 136. The process gases may flow into one or more flow ratio controllers 171, 172 prior to entering the gas injection insert 174. The gas injection insert 174 is configured to direct the process gases in a generally radially inward direction. The one or more flow ratio controllers 171, 172 and the gas injection insert 174 provide tuning of the flow rates and flow rate ratio of the process gases which enables modulating the radial gas flow velocity profile in the cross flow chamber 100 while keeping the total gas flow as well as the gas partial pressure at the injection point constant. In addition, the one or more flow ratio controllers 171, 172 and the gas injection insert 174 provide tuning of alloy composition, dopant concentration, or selectivity. The one or more flow ratio controllers 171, 172 and the gas injection insert 174 are described in detail in FIGS. 3 and 4. During the film formation process, the substrate support 106 may be located in the processing position, which is adjacent to and at about the same elevation as the gas injection insert 174, allowing the process gases to flow along a flow path 173 across the upper surface of the substrate 108 in a laminar flow fashion. The process gases exit the process gas region 156 (along flow path 175) through a gas outlet 178 located on the side of the chamber 100 opposite the gas injection insert 174. Removal of the process gases through the gas outlet 178 may be facilitated by a vacuum pump 180 coupled thereto.

A purge gas may be supplied from a purge gas source 162 to the purge gas region 158 through an optional purge gas inlet 164 (or through the gas injection insert 174) formed in the sidewall of the base ring 136. The purge gas inlet 164 is disposed at an elevation below the gas injection insert 174. During the film formation process, the substrate support 106 may be located at a position such that the purge gas flows along a flow path 165 across the back side 104 of the substrate support 106 in a laminar flow fashion. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the substrate support 106). The purge gas exits the purge gas region 158 (along flow path 166) and is exhausted out of the chamber 100 through the gas outlet 178, which is located on the side of the chamber 100 opposite the purge gas inlet 164.

Similarly, during the purging process the substrate support 106 may be located in an elevated position to allow the purge gas to flow laterally across the back side 104 of the substrate support 106. It should be appreciated by those of ordinary skill in the art that the process gas inlet, the purge gas inlet and the gas outlet are shown for illustrative purpose, since the position, size, or number of gas inlets or outlet etc. may be adjusted to further facilitate a uniform deposition of material on the substrate 108.

Figure 2:
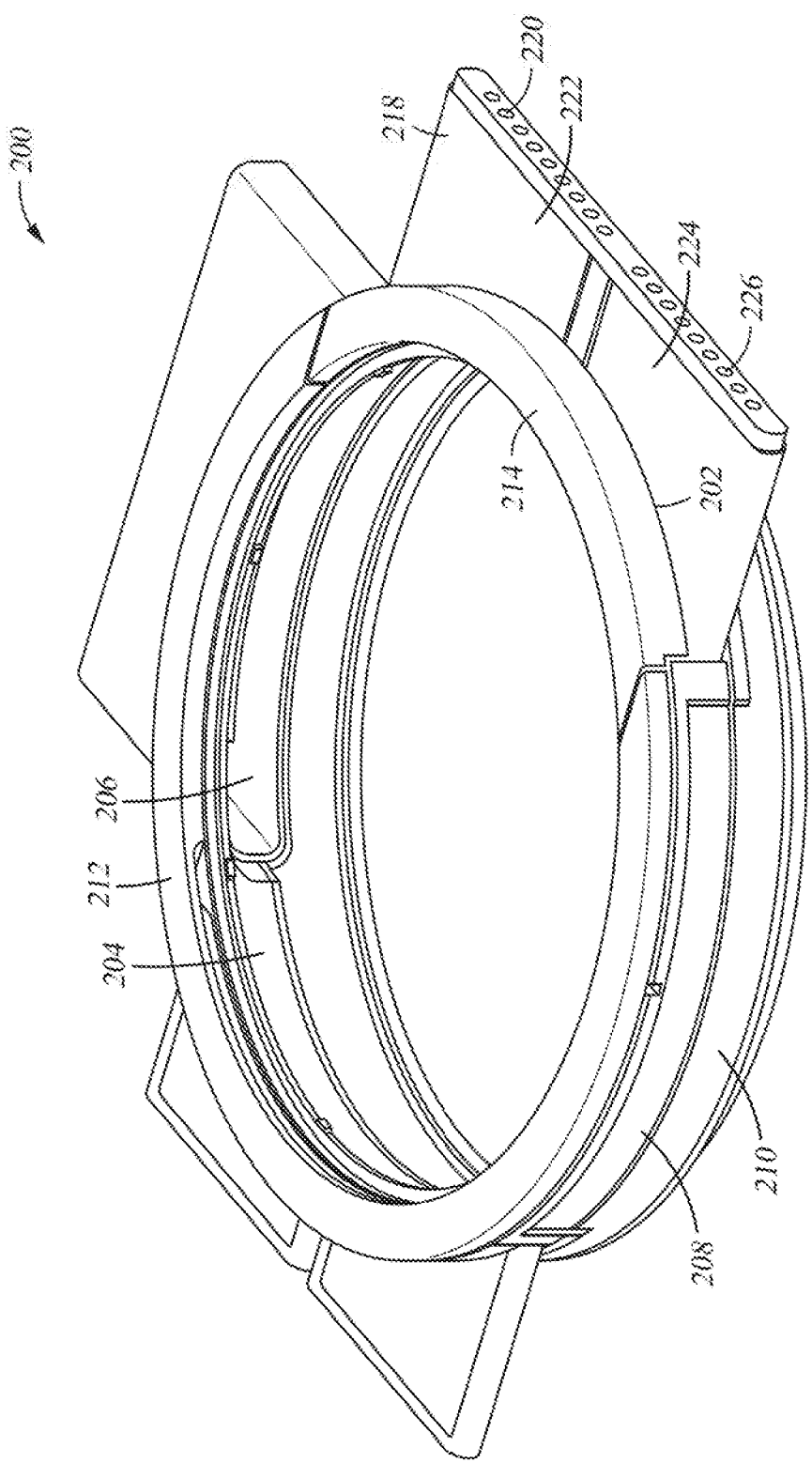
FIG. 2 is a perspective view of a liner assembly that can be used in the chamber of FIG. 1 according to implementations described herein.

FIG. 2 illustrates a perspective view of a liner assembly that can be used in place of the liner assembly 163 of FIG. 1 according to implementations described herein. The liner assembly 200 is configured for lining a processing region within a process chamber, such as the chamber 100 of FIG. 1. The liner assembly 200 generally provides a gas inlet port 202, a gas outlet port 204, and a loading port 206. The liner assembly 200 may be nested within or surrounded by a base ring (e.g., the base ring 136 of FIG. 1) disposed in the chamber. The liner assembly 200 may be formed as an integral piece, or may comprise multiple pieces that can be assembled together. In one example, the liner assembly 200 comprises multiple pieces (or liners) that are modular and are adapted to be replaced individually or collectively to provide additional flexibility and cost savings due to the modular design. Modular design of the liner assembly 200 enables easy serviceability and increased functionality (i.e. changing of different injectors). In one implementation, the liner assembly 200 comprises at least an upper liner 208 and a lower liner 210 that are stacked vertically. An exhaust liner 212 may be combined by part of the upper liner 208 to improve position stability.

The upper liner 208 and the exhaust liner 212 may be cut-out to receive an injector liner 214. The injector liner 214 is coupled to one or more gas injection inserts 218. The one or more gas injection inserts 218 may be the gas injection insert 174 shown in FIG. 1. In one implementation, one gas injection insert 218 includes a first portion 222 having a plurality of channels 220 and a second portion 224 having a plurality of channels 226. In one implementation, the first portion 222 and the second portion 224 of the gas injection insert 218 are two separate gas injection inserts 218. One or more process gases are introduced into the chamber via the channels 220, 226.

Figure 3:
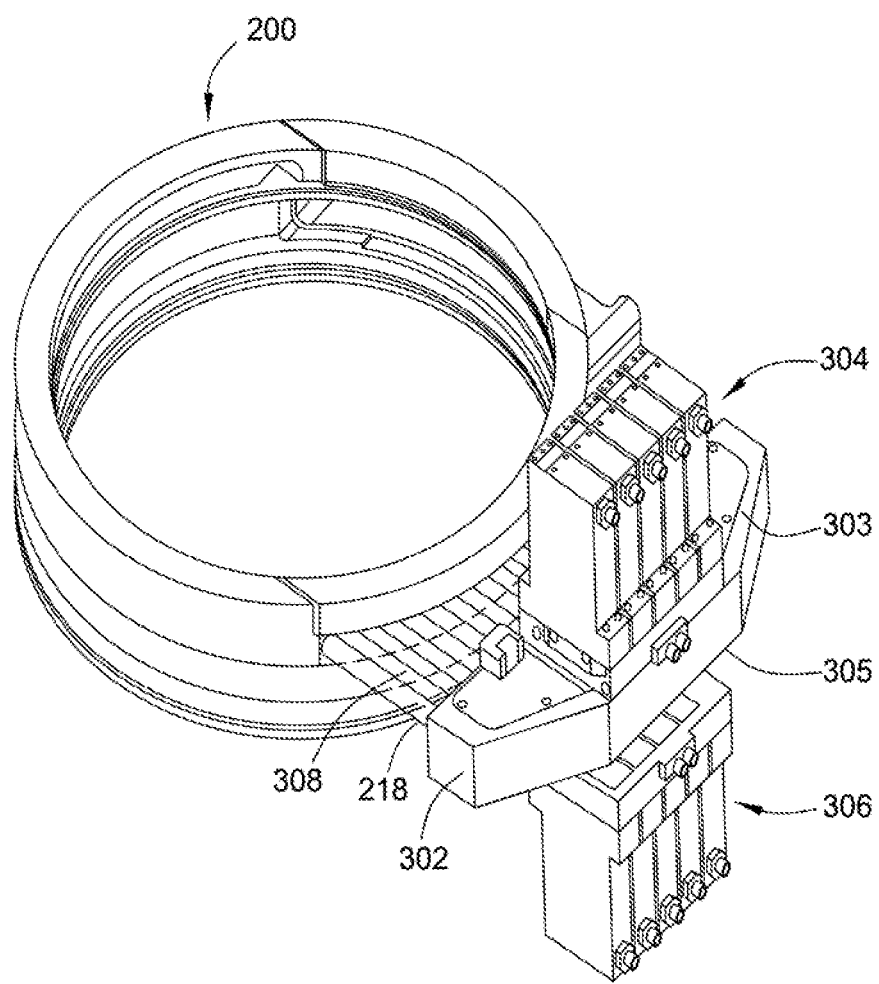
FIG. 3 is a perspective view of the liner assembly and one or more flow ratio controllers that can be used in the chamber of FIG. 1 according to implementations described herein.

FIG. 3 is a perspective view of the liner assembly 200 and one or more flow ratio controllers 304, 306 that can be used in the chamber 100 of FIG. 1 according to implementations described herein. The one or more flow ratio controllers 304, 306 may be the one or more flow ratio controllers 171, 172 shown in FIG. 1. As shown in FIG. 3, the liner assembly 200 includes the injector liner 214 and one or more gas injection inserts 218 coupled to the injector liner 214. The one or more gas injection inserts 218 are coupled to a manifold 302. The manifold 302 includes a first surface 303 and a second surface 305 opposite the first surface 303. A first flow ratio controller 304 is coupled to the first surface 303 of the manifold 302, and a second flow ratio controller 306 is coupled to the second surface 305 of the manifold 302. A plurality of tubes 308 are disposed in the gas injection insert 218, each tube 308 may be located within a corresponding channel 220, 226 (FIG. 2). The plurality of tubes 308 may be connected to the manifold 302, and process gases may flow through the manifold 302 into the chamber 100 (FIG. 1) via the plurality of tubes 308.

Figure 4:
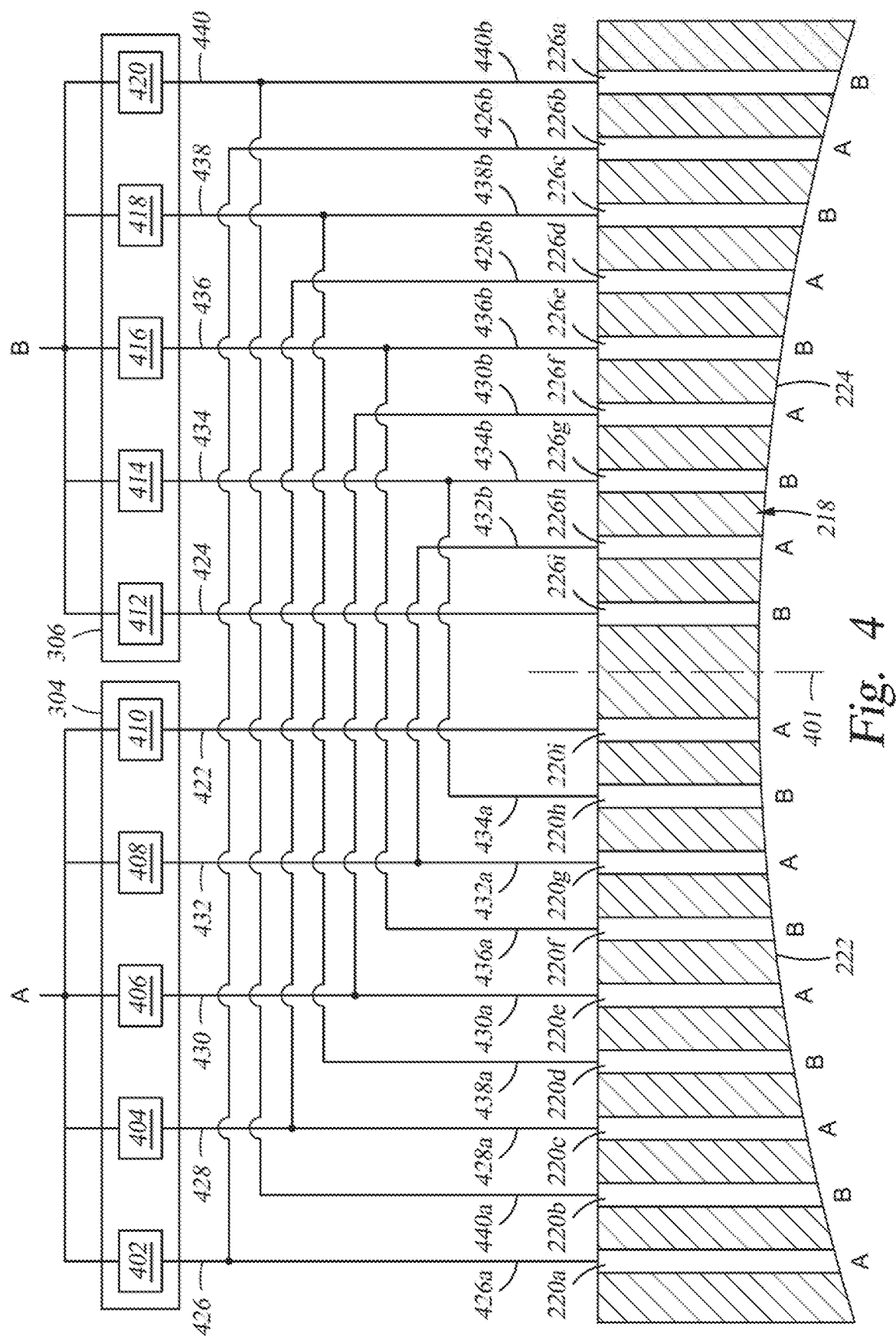
FIG. 4 schematically illustrates connections between one or more gas injection inserts and one or more flow ratio controllers that can be used in the chamber of FIG. 1 according to implementations described herein.

FIG. 4 schematically illustrates connections between one or more gas injection inserts 218 and one or more flow ratio controllers 304, 306 that can be used in the chamber 100 of FIG. 1 according to implementations described herein. As shown in FIG. 4, the gas injection insert 218 includes the first portion 222 and the second portion 224. In one implementation, the first portion 222 and the second portion 224 are separate gas injection inserts. Each portion 222, 224 includes a plurality of channels 220, 226 formed therein, and the number of channels 220 in the first portion 222 equals to the number of channels 226 in the second portion 226. In one implementation, each portion 222, 224 includes nine channels 220a-220i or 226a-226i, as shown in FIG. 4. In another implementation, each portion 222, 224 includes 11 channels. The first portion 222 and the second portion 224 may be mirror images of each other with respect to a central axis 401. The locations of the channels 220a-220i in the first portion 222 and the locations of the channels 226a-226i may be symmetrical with respect to the central axis 401. For example, the location of an inner channel 220i in the first portion 222 and the location of an inner channel 226i in the second portion 224 are symmetrical with respect to the central axis 401. The inner channel 220i is adjacent to the inner channel 226i, as shown in FIG. 4.

One or more flow ratio controllers 304, 306 are connected to the gas injection insert 218 by a plurality of gas lines. The gas lines may be any suitable lines, such as conduits or tubes, for gas or fluid to flow therethrough. In one implementation, two flow ratio controllers 304, 306 are connected to the gas injection insert 218 by the plurality of gas lines, as shown in FIG. 4. Each flow ratio controller 304, 306 includes a plurality of flow controllers, such as mass flow controllers (MFCs). In one implementation, the flow ratio controller 304 includes five flow controllers 402, 404, 406, 408, 410, and the flow ratio controller 306 includes five flow controllers 412, 414, 416, 418, 420. The number of flow controllers in each flow ratio controller 304, 306 may be more or less than five. In one implementation, there are 22 channels formed in the gas injection insert 218 (11 channels in each of the first and second portions 222, 224) and six flow controllers in each flow ratio controllers 304, 306.

The flow controllers 402, 404, 406, 408, 410, 412, 414, 416, 418, 420 are connected to the channels 220a-220i, 226a-226i (or tubes located in the channels, such as tubes 308 shown in FIG. 3) by a plurality of gas lines. The inner channel 220i of the first portion 222 is connected to the flow controller 410 in the flow ratio controller 304 by a gas line 422, and the inner channel 226i of the second portion 224 is connected to the flow controller 412 in the flow ratio controller 306 by a gas line 424. Each of the remaining flow controllers 402, 404, 406, 408 in the flow ratio controller 304 is connected to two channels, one channel in the first portion 222 of the gas injection insert 218 and the other channel in the second portion 224 of the gas injection insert 218. Each of the remaining flow controllers 414, 416, 418, 420 in the flow ratio controller 306 is connected to two channels, one channel in the first portion 222 of the gas injection insert 218 and the other channel in the second portion 224 of the gas injection insert 218. No channel in the gas injection insert 218 is connected to more than one flow controller.

For example, the flow controller 402 in the flow ratio controller 304 is connected to a first gas line 426, which splits into two gas lines 426a, 426b. The gas line 426a is connected to the channel 220a in the first portion 222, and the gas line 426b is connected to the channel 226b in the second portion 224. The flow controller 404 in the flow ratio controller 304 is connected to a second gas line 428, which splits into two gas lines 428a, 428b. The gas line 428a is connected to the channel 220c in the first portion 222, and the gas line 428b is connected to the channel 226d in the second portion 224. The flow controller 406 in the flow ratio controller 304 is connected to a third gas line 430, which splits into two gas lines 430a, 430b. The gas line 430a is connected to the channel 220e in the first portion 222, and the gas line 430b is connected to the channel 226f in the second portion 224. The flow controller 408 in the flow ratio controller 304 is connected to a fourth gas line 432, which splits into two gas lines 432a, 432b. The gas line 432a is connected to the channel 220g in the first portion 222, and the gas line 432b is connected to the channel 226h in the second portion 224. The flow controller 410 in the flow ratio controller 304 is connected to the fifth gas line 422, which is connected to the inner channel 220i in the first portion 222. The flow controller 412 in the flow ratio controller 306 is connected to the sixth gas line 424, which is connected to the inner channel 226i in the second portion 224. The flow controller 414 in the flow ratio controller 306 is connected to a seventh gas line 434, which splits into two gas lines 434a, 434b. The gas line 434a is connected to the channel 220h in the first portion 222, and the gas line 434b is connected to the channel 226g in the second portion 224. The flow controller 416 in the flow ratio controller 306 is connected to an eighth gas line 436, which splits into two gas lines 436a, 436b. The gas line 436a is connected to the channel 220f in the first portion 222, and the gas line 436b is connected to the channel 226e in the second portion 224. The flow controller 418 in the flow ratio controller 306 is connected to a ninth gas line 438, which splits into two gas lines 438a, 438b. The gas line 438a is connected to the channel 220d in the first portion 222, and the gas line 438b is connected to the channel 226c in the second portion 224. The flow controller 420 in the flow ratio controller 306 is connected to a tenth gas line 440, which splits into two gas lines 440a, 440b. The gas line 440a is connected to the channel 220b in the first portion 222, and the gas line 440b is connected to the channel 226a in the second portion 224.

The flow ratio controller 304 is connected to a first gas source, such as the gas source 177 (FIG. 1), and the flow ratio controller 306 is connected to a second gas source, such as the gas source 179 (FIG. 1). The first gas source provides a first gas (or gas mixture) A to the flow controllers 402, 404, 406, 408, 410 of the flow ratio controller 304, and the second gas source provides a second gas (or gas mixture) B to the flow controllers 412, 414, 416, 418, 420 of the flow ratio controller 306. The first gas A and the second gas B are directed to the channels 220a-220i and 226a-226i (or tubes located inside of the channels) by the gas lines 426, 428, 430, 432, 422, 424, 434, 436, 438, 440. The first gas A and the second gas B are alternately flowing through the channels 220a-220i and 226a-226i. For example, the first gas A flows through the channel 220a in the first portion 222, and the channel 220a is the outermost channel. The second gas B flows through the channel 220b, which is adjacent to the channel 220a, in the first portion 222. In other words, gases flowing through adjacent channels are provided from different gas sources, or different gases flow through adjacent channels. Due to the positioning of the two flow controllers on opposite surfaces of the manifold 302, flow of the A and B gases can be interleaved in an alternating fashion into the channels 220.

The one or more flow ratio controllers 304, 306, the one or more gas injection inserts 218, and the plurality of gas lines connecting the flow ratio controllers 304, 306 to the gas injection insert 218 as shown in FIG. 4 enables the use of two different gases or gas mixtures (A and B) with alternating injection points A-B-A-B-A-B-A-B-A=B-A-B-A-B-A-B-A-B (=denotes a central axis, such as the central axis 401 shown in FIG. 4). All of the injection points for one gas or gas mixture are grouped into pairs, except for the inner injection point, such as the inner channel 220i or 226i, which is not paired with another channel. By separating the injection points into two groups (A and B), two independent gas flow profiles can be utilized to tune alloy composition (e.g. silicon versus germanium, silicon versus carbon, germanium versus tin) or resistivity/doping concentration or selectivity (deposition precursor versus etch precursor). For example, in one implementation, the first process gas A is a silicon containing precursor and the second process gas B is a germanium containing precursor. The alloy composition of silicon and germanium in the deposited silicon germanium layer can be tuned by adjusting the flow controllers 402, 404, 406, 408, 410 relative to the flow controllers 412, 414, 416, 418, 420. In another implementation, the first process gas A is a silicon containing precursor and the second process gas B is a dopant such as a arsenic containing dopant. The dopant concentration in the deposited doped silicon layer can be tuned by adjusting the flow controllers 402, 404, 406, 408, 410 relative to the flow controllers 412, 414, 416, 418, 420. In addition, thickness non-uniformity of the deposited layer is improved. Use of a flow ratio controller that includes a number of flow controllers allows easy flow tuning among the various flow controllers.

While the foregoing is directed to implementations of the present disclosure, other and further implementations of the disclosure may be devised without departing from the basic scope thereof, and the scope thereof is determined by the claims that follow.

What is claimed is:

1. An apparatus, comprising:
a first flow ratio controller including a first plurality of flow controllers, the first flow ratio controller configured to receive a first gas through a first inlet coupled to a first gas source;
a second flow ratio controller configured to receive a second gas through a second inlet different than the first inlet, the second inlet coupled to a second gas source different than the first gas source, the second flow ratio controller fluidly isolated from the first gas source upstream of the second flow ratio controller and the first flow ratio controller fluidly isolated from the second gas source upstream of the first flow ratio controller;
a gas injection insert including a first portion and a second portion, wherein the first portion includes a first plurality of channels and the second portion includes a second plurality of channels; and
a plurality of gas lines connecting the first and second flow ratio controllers to the first and second pluralities of channels, wherein:
   a first flow controller of the first plurality of flow controllers is connected to a first gas line of a first subset of the plurality of gas lines and one channel of the first plurality of channels in order to provide a first gas from the first gas source;
   a second flow controller of the first plurality of flow controllers is connected to a second gas line of the first subset of the plurality of gas lines, one channel of the first plurality of channels, and one channel of the second plurality of channels in order to provide the first gas from the first gas source; and
   a third flow controller of the first plurality of flow controllers is connected to a third gas line of the first subset of the plurality of gas lines, one channel of the first plurality of channels, and one channel of the second plurality of channels in order to provide the first gas from the first gas source.

2. The apparatus of claim 1, wherein the first plurality of channels include nine channels and the second plurality of channels include nine channels.

3. The apparatus of claim 2, wherein the first plurality of flow controllers include five flow controllers and the second plurality of flow controllers include five flow controllers.

4. The apparatus of claim 3, wherein the plurality of gas lines include eight gas lines, and each of the eight gas lines is connected to a distinct flow controller of the first and second pluralities of flow controllers.

5. The apparatus of claim 1, wherein the first plurality of channels include eleven channels and the second plurality of channels include eleven channels.

6. The apparatus of claim 5, wherein the first plurality of flow controllers include six flow controllers and the second plurality of flow controllers include six flow controllers.

7. The apparatus of claim 6, wherein the plurality of gas lines include ten gas lines, and each of the ten gas lines is connected to a distinct flow controller of the first and second pluralities of flow controllers.

8. An apparatus, comprising:
a first flow ratio controller including a first plurality of flow controllers, the first flow ratio controller configured to receive a first gas through a first inlet;
a second flow ratio controller configured to receive a second gas through a second inlet different than the first inlet;
a gas injection insert including a first portion and a second portion, wherein the first portion includes a first plurality of channels and the second portion includes a second plurality of channels; and
a plurality of gas lines connecting the first and second flow ratio controllers to the first and second pluralities of channels, wherein:
   a first flow controller of the first plurality of flow controllers is connected to a first gas line of a first subset of the plurality of gas lines and a single channel in order to provide the first gas;
   a second flow controller of the first plurality of flow controllers is connected to a second gas line of the first subset of the plurality of gas lines, one channel of the first plurality of channels, and one channel of the second plurality of channels in order to provide the first gas;
   a third flow controller of the first plurality of flow controllers is connected to a third gas line of the first subset of the plurality of gas lines, one channel of the first plurality of channels, and one channel of the second plurality of channels in order to provide the first gas; and
   wherein gas lines of a second subset of the plurality of gas lines are connected between the second flow ratio controller and another two channels to provide the second gas independently from the first gas, wherein one of the another two channels is from the first plurality of channels and the other of the another two channels is from the second plurality of channels.

9. The apparatus of claim 8, wherein the first plurality of channels include eight channels and the second plurality of channels include eight channels.

10. The apparatus of claim 9, wherein the first plurality of flow controllers include four flow controllers and the second plurality of flow controllers include four flow controllers.

11. The apparatus of claim 8, wherein the first plurality of channels include ten channels and the second plurality of channels include ten channels.

12. The apparatus of claim 11, wherein the first plurality of flow controllers include five flow controllers and the second plurality of flow controllers include five flow controllers.

13. An apparatus, comprising:
a chamber, comprising:
   an upper dome;
   a lower dome;
   a base ring disposed between the upper dome and the lower dome; and
   a gas injection insert located within the base ring, wherein the gas injection insert includes a first portion and a second portion, wherein the first portion includes a first plurality of channels and the second portion includes a second plurality of channels, the first plurality of channels and the second plurality of channels configured to introduce gas flow asymmetrical with respect to a central axis;
a first flow ratio controller including a first plurality of flow controllers, the first flow ratio controller configured to receive a first gas through a first inlet;
a second flow ratio controller configured to receive a second gas through a second inlet different than the first inlet;
a first branched conduit coupled to a first gas source, the first branched conduit disposed between the first gas source and the first flow ratio controller;

a second branched conduit coupled to a second gas source, the second branched conduit disposed between the second gas source and the second flow ratio controller, and the second branched conduit fluidly isolated from the first branched conduit upstream of the first and second flow ratio controllers; and a plurality of gas lines connecting the first and second flow ratio controllers to the first and second pluralities of channels, wherein:

a first flow controller of the first plurality of flow controllers is connected to a first gas line of a first subset of the plurality of gas lines and one channel of the first plurality of channels in order to provide a first gas;

a second flow controller of the first plurality of flow controllers is connected to a second gas line of the first subset of the plurality of gas lines, one channel of the first plurality of channels, and one channel of the second plurality of channels in order to provide the first gas; and a third flow controller of the first plurality of flow controllers is connected to a third gas line of the first subset of the plurality of gas lines, one channel of the first plurality of channels, and one channel of the second plurality of channels in order to provide the first gas.

14. The apparatus of claim 13, wherein the first plurality of channels include nine channels, the second plurality of channels include nine channels, the first plurality of flow controllers include five flow controllers, and the second plurality of flow controllers include five flow controllers.

15. The apparatus of claim 14, wherein the plurality of gas lines include eight gas lines, and each of the eight gas lines is connected to a distinct flow controller of the first and second pluralities of flow controllers.

16. The apparatus of claim 13, wherein the first plurality of channels include eleven channels and the second plurality of channels include eleven channels.

17. The apparatus of claim 16, wherein the first plurality of flow controllers include six flow controllers and the second plurality of flow controllers include six flow controllers.

18. The apparatus of claim 17, wherein the one or more gas lines of the plurality of gas lines include ten gas lines, and each of the ten gas lines is connected to a distinct flow controller of the first and second pluralities of flow controllers.

19. The apparatus of claim 13, wherein the chamber further comprises:

a liner assembly, wherein the liner assembly comprises:
an upper liner;
a lower liner;
an exhaust liner disposed over the upper liner; and
an injector liner coupled to the gas injection insert.

20. The liner assembly of claim 19, wherein the injector liner is coupled to the gas injection insert.

* * * * *